United States Patent

Huignard et al.

[11] Patent Number: 5,122,766
[45] Date of Patent: Jun. 16, 1992

[54] ACOUSTIC WAVE DELAY SYSTEM WITH AN OPTICALLY CONTROLLED DELAY MEDIUM

[75] Inventors: Jean-Pierre Huignard, Paris; Philippe Defranould, Nice, both of France

[73] Assignee: Thomson-CSF, Puteaux, France

[21] Appl. No.: 453,843

[22] Filed: Dec. 20, 1989

[30] Foreign Application Priority Data

Dec. 20, 1988 [FR] France ............................ 88 16812

[51] Int. Cl.$^5$ ............................................. H03H 9/38
[52] U.S. Cl. ........................................ 333/144; 333/147
[58] Field of Search ................ 333/141, 142, 144, 147

[56] References Cited

U.S. PATENT DOCUMENTS

| | | | |
|---|---|---|---|
| 2,965,851 | 12/1960 | Moy, Jr. ............................ | 333/142 |
| 3,145,354 | 8/1964 | Hutson .............................. | 333/144 |
| 3,150,275 | 9/1964 | Lucy ............................... | 333/147 X |
| 3,185,942 | 5/1965 | White .............................. | 333/144 |
| 3,234,488 | 2/1966 | Fair ................................ | 333/144 X |
| 3,300,739 | 1/1967 | Mortley ........................... | 333/142 X |
| 3,431,504 | 3/1969 | Adler .............................. | 333/141 X |
| 3,463,573 | 8/1969 | Brienza ........................... | 350/358 |
| 3,544,806 | 12/1970 | De Maria et al. .............. | 333/144 X |
| 3,742,375 | 6/1973 | Farah .............................. | 330/55 |
| 4,609,890 | 9/1986 | Oates et al. .................... | 333/147 X |

Primary Examiner—Eugene R. LaRoche
Assistant Examiner—Benny Lee
Attorney, Agent, or Firm—Oblon, Spivak, McClelland, Maier & Neustadt

[57] ABSTRACT

A delay device for a frequency signal comprises an element made of acousto-optical material, provided with a first piezo-electric transducer transmitting an acoustic signal in the element and with a second piezo-electric transducer capable of detecting an acoustic wave. A light beam goes through the element and creates a field charge in the element. This charge field plays the role of a reflector for the acoustic wave transmitted by the transducer. By translating the beam along the direction Z, the propagation time of the transmitted acoustic wave is made to vary.

16 Claims, 4 Drawing Sheets

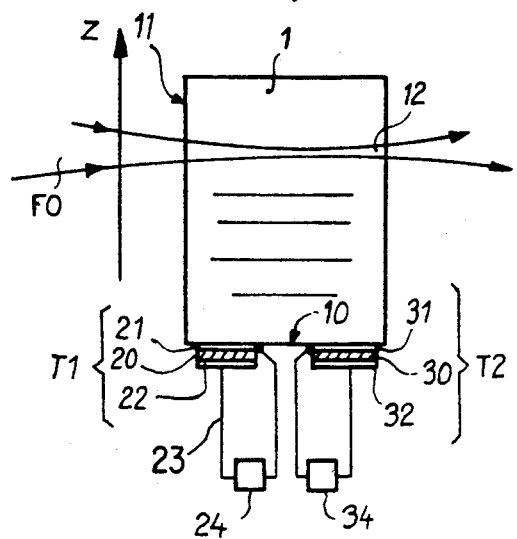
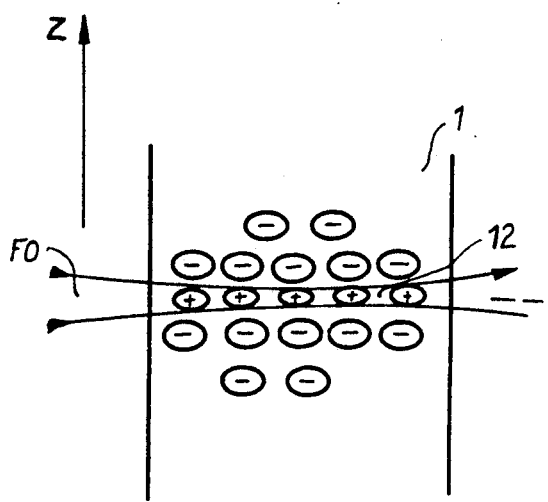
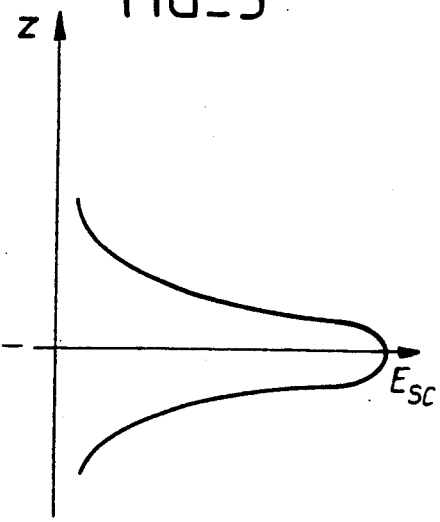

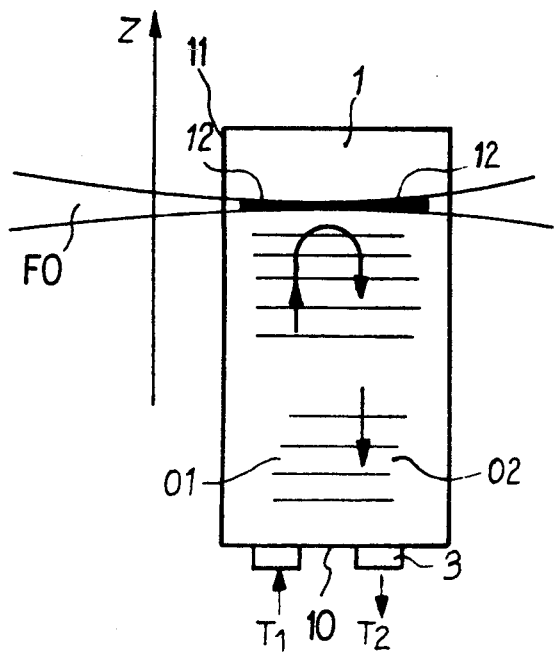
FIG_4
FIG_5
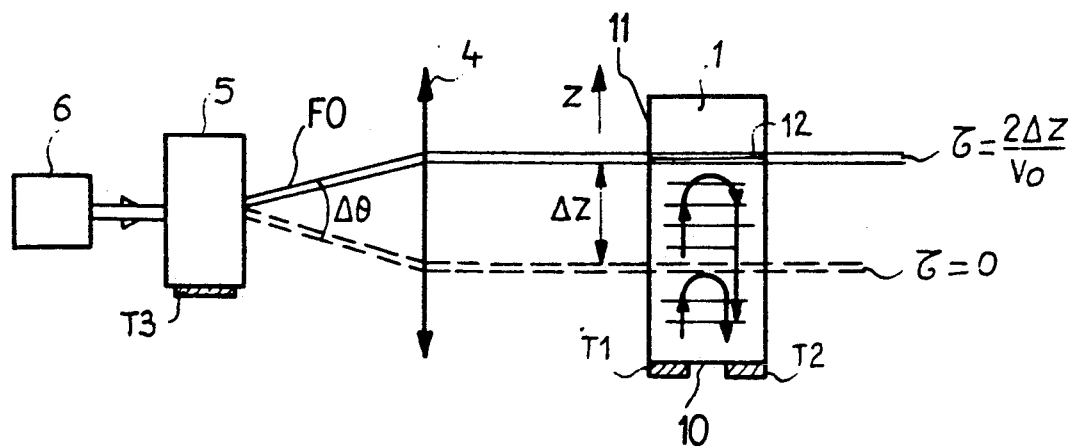

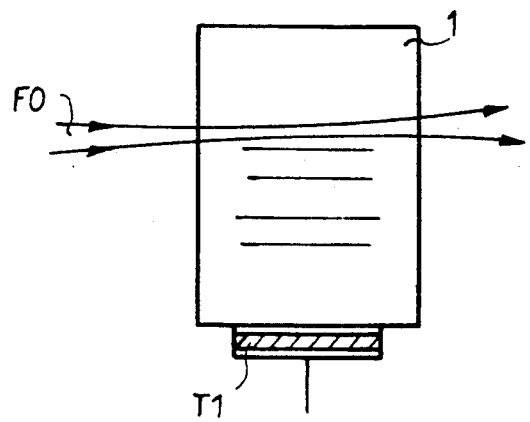
FIG_6
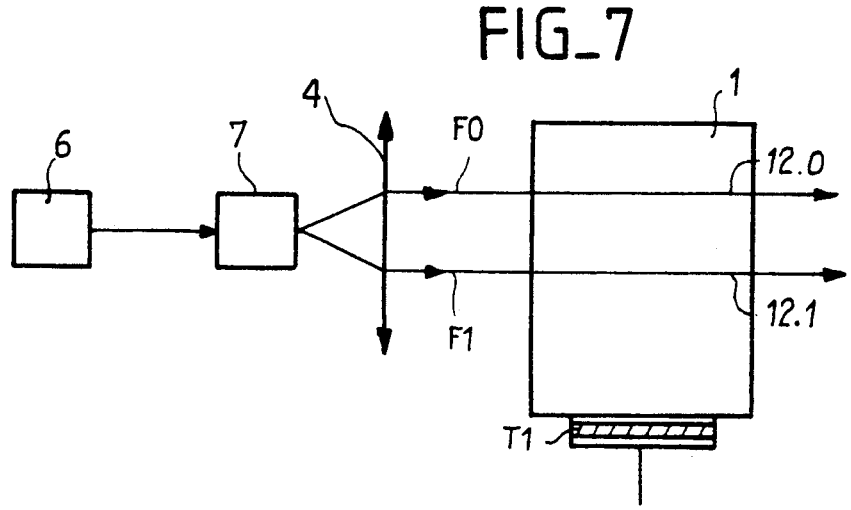
FIG_7
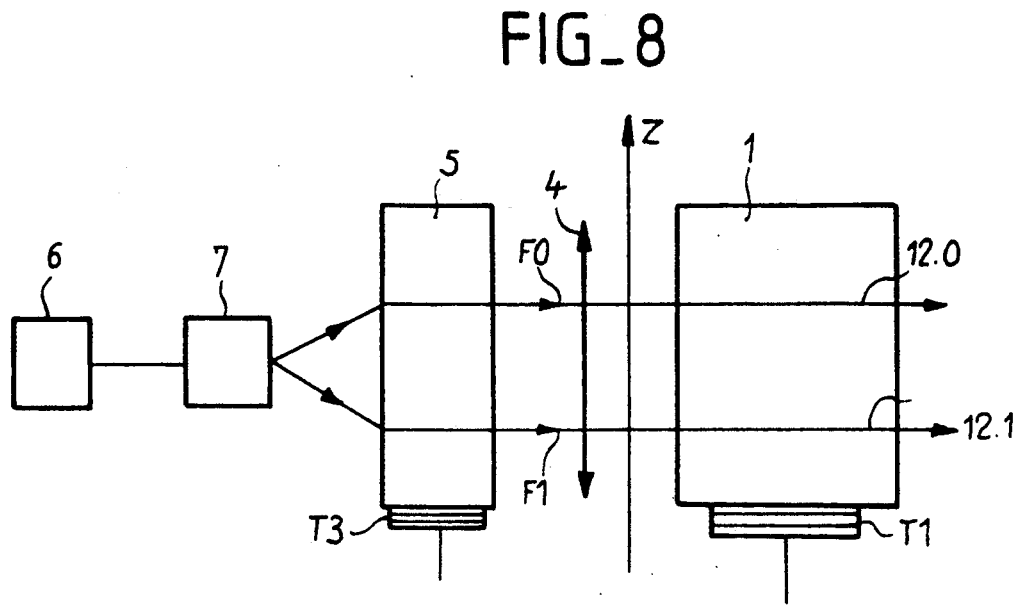
FIG_8

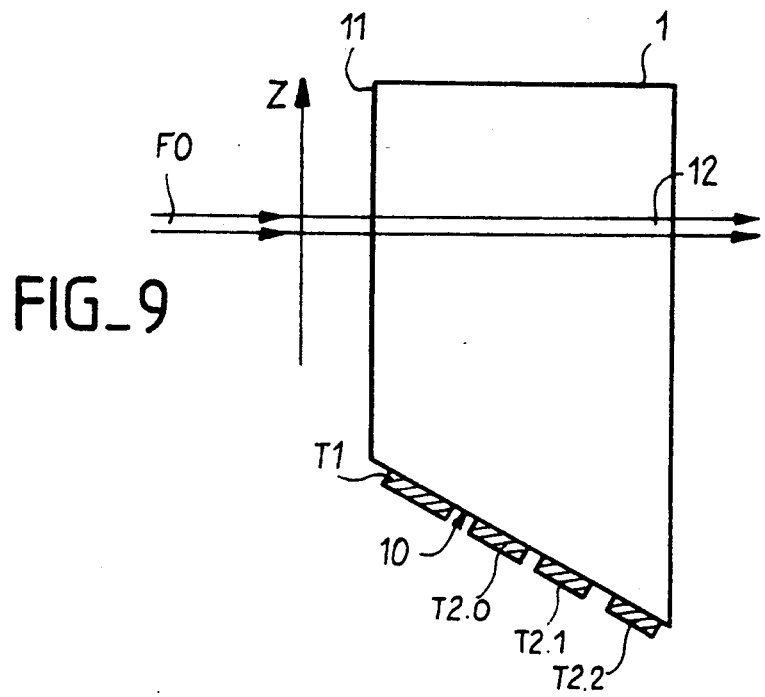
FIG_9
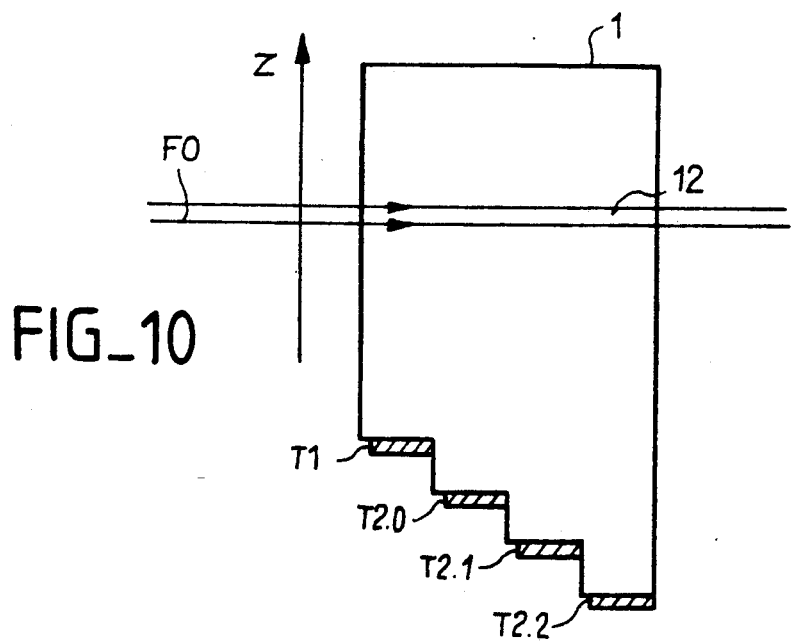
FIG_10

ACOUSTIC WAVE DELAY SYSTEM WITH AN OPTICALLY CONTROLLED DELAY MEDIUM

BACKGROUND OF THE INVENTION

1. Field of the Invention

The invention pertains to a delay device for a frequency signal and, notably, to a delay line device for microwave signals as well as to a system applying this device.

More particularly, the invention concerns an acoustic delay line device that is continuously variable by electronic control.

The main applications thereof are in the processing of wide-band radar signals for the control of the scanning of an electronic antenna.

For this, control is achieved by acting on the delays of the different elements of the antenna.

2. Description of the Prior Art

In prior art devices, these delays are generated by coaxial lines or wave guides (such as symmetrical strip lines) associated with switch-over devices. However, devices such as these are bulky and occupy much space.

The French patent application No. 87 05267 describes a system enabling the generation of delays for microwave signals using optical means. These signals make it possible to produce a microwave signal by the beating of two light waves. There are several light paths available, each making it possible to control an antenna element. The different paths have different lengths. This enables the generation of the relative delays in the control of the different antenna elements.

However, a system of this kind does not enable the generation of continuously variable delays.

The invention concerns a device that can be used to vary the delay of a microwave signal in a continuously variable manner.

SUMMARY OF THE INVENTION

The invention therefore concerns a delay device for a frequency signal comprising:
- an element made of an acousto-optical material comprising a first face and a second face forming an angle with each other;
- at least one first piezoelectric transducer placed on the first face, transmitting an acoustic signal in the element along a first direction and detecting an acoustic signal arriving at the first face;
- at least one light source transmitting a light beam towards the second face of the element, said light beam going through the element in the second direction which is substantially perpendicular to the first direction, and creating a charge field in the element along this second direction.

The invention also concerns a system for the application of the delay device, said system having an optical deflector between the light source and the element made of acousto-optical material.

BRIEF DESCRIPTION OF THE DRAWINGS

The different objects and features of the invention will appear more clearly in the following description, made with reference to the appended drawings, of which:

FIG. 1 shows an exemplary embodiment of the delay device according to the invention;

FIGS. 2 and 3 diagrammatically illustrate the charge field and the acoustic element of FIG. 1.

FIG. 4 illustrates the generated and reflected wave produced by the transducer T1 in the space charge region;

FIG. 5 shows a more complete exemplary embodiment of the device of the invention;

FIG. 6 shows a variant of the device of the invention;

FIGS. 7 and 8 show a variant of the device of FIG. 5;

FIGS. 9 and 10 show devices according to the invention including several receiver piezoelectric transducers.

DETAILED DESCRIPTION OF THE INVENTION

Referring to FIG. 1, we shall first of all describe a delay device for a microwave signal according to the invention.

This device has an element 1 made of an acousto-optical material. This element provides on one of its faces 10 an acoustic wave transmitting transducer T1 and an acoustic wave detecting transducer T2.

Each transducer is made of a piezoelectric material framed by two electrodes. The transducer T1 is thus formed by a piezoelectric element 20 enclosed between two electrodes 21 and 22 enabling electrical excitation pulses to be applied to it by means of the connection 23 and a generator 24.

The electrode 21 is in contact with the face 10, thus enabling the transducer T1 to induce acoustic waves in the element 1.

The transducer T2 is formed by a piezoelectric element 30 enclosed between two electrodes 31 and 32, connected to an electric detection device 34. The electrode 31 is in contact with the face 10 and enables the transducer T2 to detect an acoustic wave arriving at the face 10.

Furthermore, the face 11 of the element 1 receives a light beam F0 which goes through the element. According to the exemplary embodiment of FIG. 1, the beam F0 is substantially perpendicular to the direction of propagation of the acoustic wave transmitted by the transducer T1.

Furthermore, a device which is not shown in FIG. 1 enable the beam F0 to be shifted parallel to its direction so that the illumination of the element i shifted along the direction Z.

The proposed device relies on the use of the following two effects:
- the generation, in the volume of the acoustic material, of a space charge field that locally modifies the speed of the acoustic wave;
- the reflection of the acoustic bulk wave on the space charge zone 12, photo-induced in the material 1. The position of this zone is checked by means of a laser beam F0.

To obtain the generation of a photo-induced acoustic mirror, the material 1 used is therefore a material enabling the propagation of acoustic waves, and medium of propagation also has non-linear optical properties. For example, this material could be one of the following:

$LiNbO_3$, BSO, BGO, GaAs, InP

Consequently, under local illumination by a laser beam, it is possible to induce a space oharge field capable of modifying both the optical index and the acoustic index of refraction of the medium. The charge field is shown in FIG. 2, and it is seen that a maximum amount of charge, shown by the curve of figure 3 where the space charge field is represented by $E_{sc}$, is localized in the zone 12.

The physical phenomena brought into play may be described as follows: since the medium of propagation of the acoustic wave is illuminated by a focused laser beam, the photocarriers generated and "re-trapped" in the peripheral region of the beam create a space charge zone which is a replica of the incident illumination. The modulation of the electric field corresponding to the photo-induced space charge induces an elementary reflection of the acoustic wave with a reflection coefficient R given by the relationship:

$$\Delta R = \tfrac{1}{2}[K+d]\Delta E_{sc}$$

where K and d are respectively the electro-acoustic coefficient and the piezoelectric coefficient of the medium 1 and $\Delta R$ is the variation of the reflection coefficient. $\Delta E_{sc}$ is the variation in the space charge field. Theoretical evaluations relating to $LiNbO_3$ show, for example, that for a photo-induced electrical field where $\Delta E_{sc} = 10$–$50$ $kV.cm^1$, the elementary reflection coefficient of the acoustic wave on this localized space charge region may be estimated at $\Delta R = 10^{-4}$ to $10^{-3}$ (acousto-photorefractive effect).

The transducer T1 transmits an acoustic wave 01 and, according to the scheme of the device indicated in FIG. 4, the reflected acoustic wave 02 is detected either by the transmitting t-ransducer T1 itself or by the transducer T2.

Depending on the position of the beam F0 with respect to the face 10 of the element, the time taken by the acoustic wave transmitted by transducer T1 to reach the space charge region 12 and then to be reflected and subsequently reach the transducer T2 is variable. By shifting the beam F0 along the direction Z, the length of the path of the acoustic beam and, hence, its time of propagation are modified. Hence, a continuously variable delay device is made.

FIG. 5 shows a system enabling the beam F0 to be shifted along the direction Z to as to achieve a continuously variable delay between $t=0$ and $T=2\Delta Z/V_0$ on the acoustic signal.

This system includes the device of figure namely the element 1 provided on its face 10 with piezoelectric transducers T1 and T2, with its face 11 illuminated by the light beam F0. The light beam F0 is given by a light source 6 (laser source).

an optical deflector 5;
a focusing lens 4.

By way of example, the deflector 5 is made in the form of an acousto-optical deflector (Bragg cell). It has a deflector element 5, made of an acousto-optical material, of the same type as that of the element 1, having a piezoelectric transducer T3. The transducer T3 is of the same type as the transducers T1 and T2. The transducer T3 thus enables the generation of the acoustic waves in the deflector 5 and the inducing of an index grating ehabling the deflection of the beam F0 given by the source 6.

The frequency of the excitation signal of the transducer determines the pitch of the index grating which, itself, determines the angle of deflection $\Delta\theta$ of the beam F0.

The deflector 5 is placed in the focal plane of the focusing lens 4. This lens retransmits the beam received from the deflector in a direction parallel to the optical axis of the lens 4.

The combination of the deflector 5 and the lens 4 thus enables the beam F0 to be shifted parallel to itself along the direction Z.

It is thus seen that, through deflection of the beam coming from the source 6, the device of FIG. 5 enables the translation of the beam F0 along the axis Z and, hence, the modification of the delay given to the transmission or the signal received at the transducer T1 and retransmitted to the transducer T2.

Depending on the frequency of the microwave signal applied to the transducer T3 of the deflector, the spatial position $\Delta z$ of the space charge zone in the element 1 varies according to the relationship:

$$\Delta z = f. \lambda/v_s \Delta F$$

f = focal length of the lens 4
v = speed of the sound wave in the deflection cell 5
$\Delta F$ = pass band of the deflection cell 5
$\lambda$ = length of light wave.

Under these conditions, the checking of the spatial position of the "photoinduced acoustic mirror" 12 introduces a delay in the acoustic bulk wave generated by tne transducer T1 such that:

$$C = 2\Delta z/v_0$$

where C is the speed of the acoustic bulk wave $v_0$: speed of the acoustic wave in the propagation medium.

The device of the invention is therefore controlled by the deflection of a laser beam inducing a local variation in reflectivity of the acoustic wave being propagated in the volume or on the surface of the material of interaction.

According to an alternative embodiment shown in FIG. 6, the element 1 has only one piezoelectric transducer T1, working alternately as an acoustic wave transmitter and an acoustic wave detector.

According to another variant, the element 1 may receive several light beams, each creating a space charge plane. For example, in FIG. 7, two beams F0 and F1 are provided. These two beams are obtained by a division of the beam coming from the source 6 by means of a beam separator 7. The beams F0 and F1 are made parallel by an optical device 4 (lens). It could equally well have been possible to provide for on light source per beam F0, F1. It is also possible to provide for more than two light beams.

The beams F0 and F1 create space charge planes 12.0 and 12.1. An acoustic wave transmitted by the transducer T1 is partially reflected by the space charge plane 12.1 and the non-reflected part is partially reflected by the charge plane 12.0. The transducer T1 thus receives, in return, two acoustic waves that have undergone different delays.

It is quite clear that, in the device of FIG. 7, provision can be made for one transmitting transducer T1 and one or more detection transducers such a T2 in FIG. 1.

FIG. 8 shows a variant of the device of figure 7, wherein there is provision for a deflector 5 such as the one of FIG. 5. The deflector 5 is placed between the beam separator 7 and the element 1. Depending on the frequency signal applied to the transducer T3, the index grating created in the transducer 5 enables the two beams F0 and F1 to be translated along the direction Z. The space charge planes 12.0 and 12.1 can therefore be shifted along the direction Z and it is possible to cause variation in the delays assigned to the acoustic waves reflected towards the transducer T1.

FIG. 9 shows another variant of the device of the invention wherein the face 10 of the element 1 forms an angle with the direction of the light beam F0 and, therefore, forms an angle with the space charge plane 12. The face 10 is provided with several piezoelectric transducers such as an transmitting transducer T1 and three detector transducers T2.0, T2.1 and T2.3.

An acoustic wave transmitted by the transducer T1 is reflected by the space charge plane 12 and takes different periods of time to reach the transducers T2.0 and T2.2. The detections in the different transducers T2.0 and T2.1 and T2.2 will therefore be given different delays depending on the positions of the detectors on the face 10.

Thus, fixed, staggered delays are obtained. By making the beam F0 translate along the axis Z, it is further possible to associate a continuously variable setting with these fixed delays.

FIG. 10 shows a variant of the device of figure wherein, instead of the structure of FIG. 9, a stepped structure is made. A transducer T1, T2.0, T2.1, T2.2 is provided at each stage in such a way that each transducer is substantially parallel to the plane of the acoustic wave transmitted by the transducer T1 and of this wave reflected by the space charge plane 12.

For example, the device of the invention may have the following characteristics:

*Element 1

Medium of propagation of the acoustic wave (element 1): GaAs;

Speed of propagation in the element 1, $$v_0 = 5300 \text{ ms}^{-1}$$

Length of the medium of the element 1, $$L = 2 \text{ cm.}$$

Transducer: GaAs or LiNbO$_3$
*longitudinal bulk waves
Microwave signal:
  central frequency: 500 MHz
  pass band: 500 MHz
  Variable delay: $\tau = 0$ to $\tau = 7.5$ microseconds
*Acousto-optical deflector 5 for the recording of the space charge field in GaAs at the wavelength $\lambda = 1.06$ μm:
  Bragg cell: TeO$_2$
  Number of points: $N = 10^3$
  Angular deflection: $\Delta\theta = 6°$
  Efficiency > 50%
  Diameter of the beam: $\phi = 2$ mm
  Access time: 5–10 μsec
*Dimensions of the beam focused for the recording of the space charge zone:
  Width = $\Delta Z/N = 20$ 82 m
  Height = 1 mm (height of the acoustic column)
*Characteristic of the cylindrical lens 4 for focusing on the propagation medium
  Focal length $$F = \Delta Z / \Delta\theta$$

$$F = 200 \text{ mm}$$

Recording time of the space charge region in GaAs $$t = 1 \text{ μs}$$

*Laser source

This value of t corresponds to an incident laser power on the photorefractive medium equal to $P = 10$ mW.

A device thus described enables the following advantages to be obtained:

The making of a novel acoustic bulk wave device with delay variable from $\tau = 0$ to $\tau = 10$ μs (typically).
  Interaction materials usable: GaAs, BSO, LiNbO$_3$,
  Bulk wave—frequency range usable: 100 MHz to 3 GHz typically.

The device of the invention uses electro-optical materials such as those described in the documents:

P. Gunter and JP Huignard, *Photorefractive Materials and their Applications*, vol. 61, Springer Verlag, 1968.

D. E. Oates et al. (MIT, Lincoln Laboratories), *Holographic Grating Acoustic Devices*, APL, May 85.

It is quite clear that the above description has been given purely as a non-restrictive example and that other variants can be envisaged without going beyond the scope of the invention. The numerical examples and the nature of the materials indicated have been given solely in order to illustrate the description.

What is claimed is:

1. A delay device for a frequency signal comprising:
   an element made of an acousto-optical material comprising a first face and a second face forming an angle with each other;
   piezoelectric transducer means placed on the first face, transmitting an acoustic signal in the element along the first direction and detecting any acoustic signal arriving at the first face;
   means for transmitting at least one light beam toward the second face of the element each of said at least one light beam being at a respective predetermined location along said first direction and simultaneous with said acoustic signal transmission along said first direction, each of said at least one light beam passing through the element in a second direction at said respective predetermined location, which second direction is substantially perpendicular to the first direction, and each of said at least one beam creating a respective charge field in the element along the second direction at substantially said respective predetermined location wherein a portion of said acoustic signal is reflected off each of the charge fields created by each of said at least one light beam and returned to said first face so that said acoustic signal has a propagation time inside said element which is proportional to a respective distance along said first direction between said piezoelectric transducer means and each of said charge fields created by each of said at least one light beam.

2. A delay device according to claim 1, wherein said first face of said element is parallel to said second direction.

3. A delay device according to claim 1, wherein the first face and the second face of the element are configured to be substantially perpendicular to each other.

4. A system applying the delay device according to claim 1, including an optical deflector disposed between the means for transmitting at least one light beam and the element.

5. A delay system according to claim 4, including a focusing lens disposed between the optical deflector and the element.

6. A delay device according to claim 4, wherein the optical deflector is an acousto-optical cell.

7. A delay device according to claim 1, wherein the element is a photorefractive crystal having a variable refractive index.

8. A delay device according to claim 1, wherein the means for transmitting at least one light beam is a collimated laser source.

9. A delay device according to claim 1, wherein said means for transmitting at least one light beam includes a means for transmitting two light beams, with each of said two light beams being transmitted through the second face of the element, each light beam creating a respective first and second charge field.

10. A delay device according to claim 1 wherein said means for producing at least one light beam include a beam separator for receiving light from a single source and outputting several beams to the second face.

11. A delay device according to claim 10, including an optical deflector disposed between the single light source and the beam separator.

12. A delay device according to claim 1, wherein the frequency signal is a microwave signal.

13. A delay device according to claim 1, wherein said piezoelectric transducer means includes a first piezoelectric transducer means placed on the first face, transmitting said acoustic signal in the element along said first direction and a second piezoelectric transducer means placed on the first face of the element and detecting any acoustic signal, including the acoustic signal transmitted by the first transducer and being reflected by said at least one charge field.

14. A delay device according to claim 13, wherein the first piezoelectric transducer and the second piezoelectric transducer each comprise a piezoelectric material enclosed between two electrodes, the first piezoelectric transducer being excited by an electrical signal with a determined frequency applied to its electrodes and providing the acoustic signal to the element, the second piezoelectric transducer receiving said any acoustic signal and providing an electric signal with substantially the same frequency as that of the signal applied to the first transducer.

15. A delay device according to claim 13, wherein said first face of the element is inclined with respect to said second direction and wherein said second piezoelectric transducer means includes a plurality of detecting piezoelectric transducers distributed along said first face.

16. A delay device according to claim 13, wherein said first face includes a series of steps with a first step having said first piezoelectric transducer placed thereon and wherein said second piezoelectric transducer means includes a plurality of detecting piezoelectric transducers with each one of said plurality of piezoelectric transducers being placed on a respective remaining another one of said series of steps, enabling a range of fixed delays to be obtained.

* * * * *